(12) United States Patent
Kao (10) Patent No.: US 7,192,823 B2
(45) Date of Patent: Mar. 20, 2007

(54) MANUFACTURING METHOD FOR TRANSISTOR OF ELECTROSTATIC DISCHARGE PROTECTION DEVICE

(75) Inventor: Jung-Cheng Kao, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 260 days.

(21) Appl. No.: 10/918,433

(22) Filed: Aug. 16, 2004

(65) Prior Publication Data

US 2005/0045954 A1    Mar. 3, 2005

(30) Foreign Application Priority Data

Aug. 27, 2003   (CN) .............................. 03 1 50600

(51) Int. Cl.
H01L 21/8238    (2006.01)
(52) U.S. Cl. ................ 438/200; 438/529; 257/E21.636
(58) Field of Classification Search ................ 438/200, 438/307, 529, 965; 257/E21.636
See application file for complete search history.

(56) References Cited

U.S. PATENT DOCUMENTS 6,274,911 B1* 8/2001 Lin et al. .................... 257/358
6,514,839 B1* 2/2003 Ker et al. .................... 438/305
6,566,717 B2* 5/2003 Jung .................... 257/E21.636

* cited by examiner

Primary Examiner—Chandra Chaudhari
(74) Attorney, Agent, or Firm—Rosenberg, Klein & Lee (57) ABSTRACT

A manufacturing method for a transistor of an ESD protection device. First, the method forms basic elements on a semiconductor base. Next, a patterned resist layer is used as a mask to perform ion implantation in the emerged drain region so that the dopant can be implanted into the semiconductor base under the drain region to form an extended drain heavy-doped region. Then, the patterned resist layer is removed and a heat tempering processing is performed. Finally, a self-aligned salicide is formed on the surfaces of the polysilicon gate and the heavy-ion doped region. The invention utilizes an extended drain heavy-doped region as a resistance ballast between the drain contact and the polysilicon contact surface, which allows high current generated by ESD to be discharged in a more homogeneous way so as to prevent the ESD structure from being damaged.

15 Claims, 8 Drawing Sheets

MANUFACTURING METHOD FOR TRANSISTOR OF ELECTROSTATIC DISCHARGE PROTECTION DEVICE

BACKGROUND OF THE INVENTION

1. Field of the Invention

The present invention relates to a manufacturing method for an ESD (electrostatic discharge) protection device and, more particularly, to a manufacturing method for a gate-ground MOS transistor used for an ESD protection circuit.

2. Description of the Prior Art

Among current deep sub-micron devices, ggN/PMOS devices have been broadly applied for protecting from ESD. The feature of ggN/PMOS lies in functionality of its parasitic bipolar transistor. When high voltage instantaneously occurs, the parasitic bipolar transistor can be triggered, guiding high current generated by high voltage to the terminal of Vss or Vdd accordingly.

Figure 1:
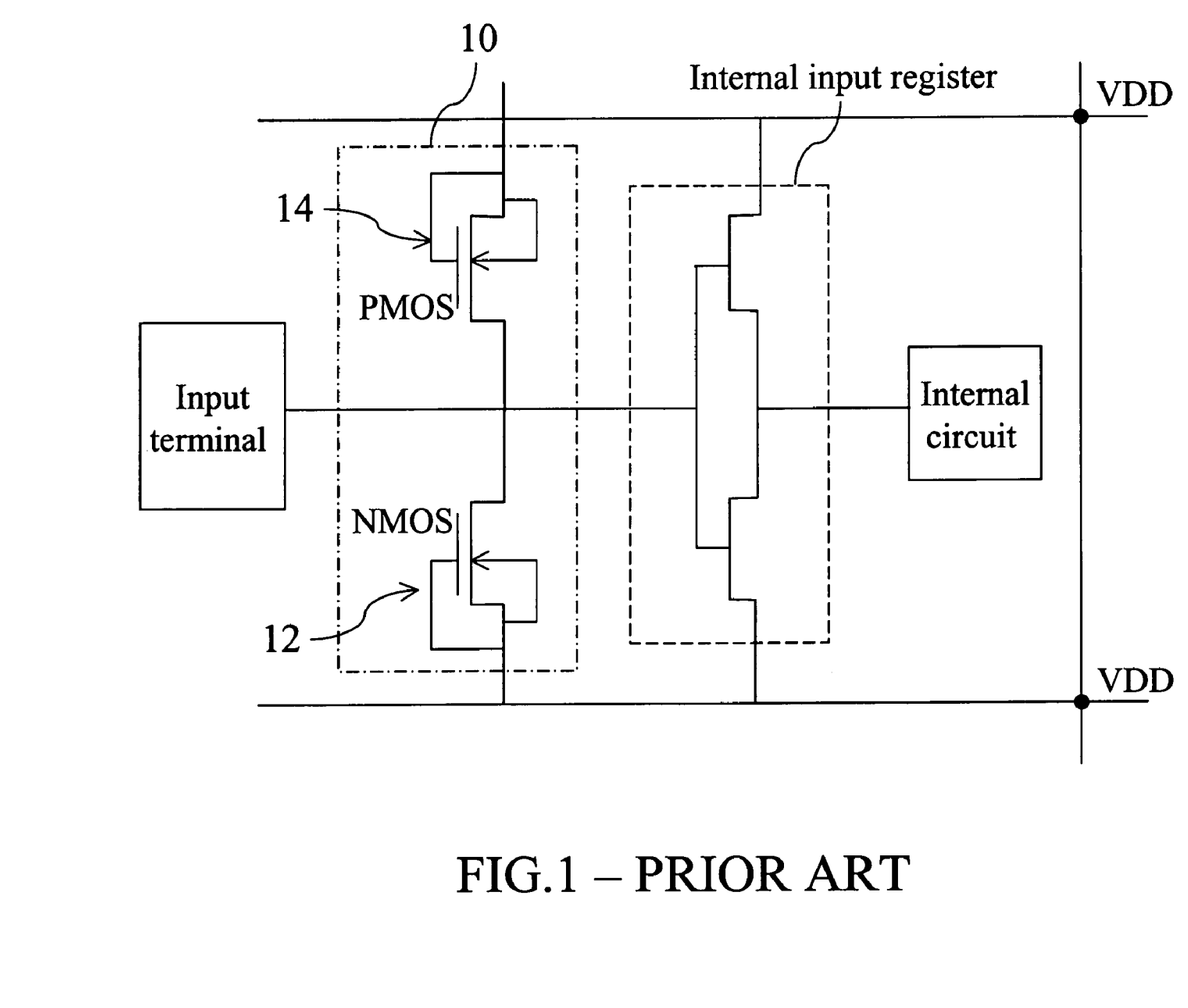
FIG. 1 is a schematic diagram illustrating the circuit structure of conventional MOS elements for ESD protection device applied to IC.
Figure 2:
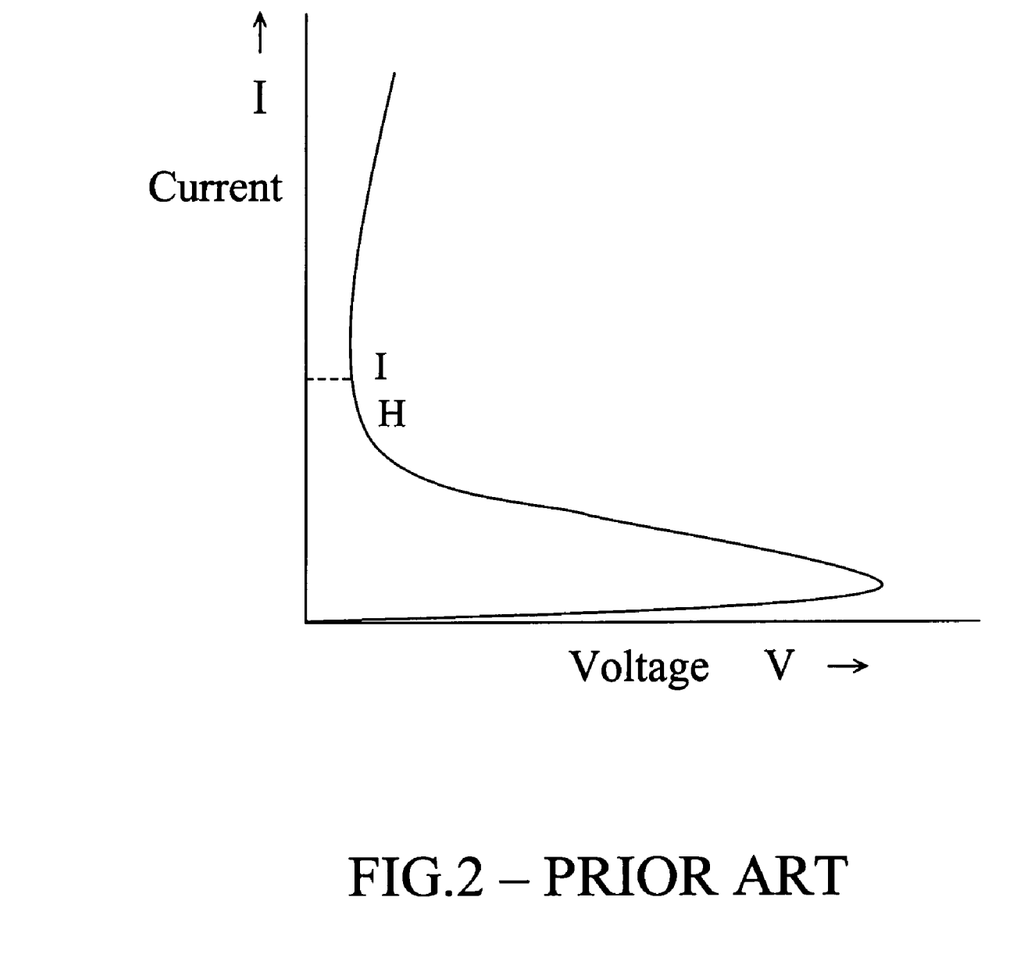
FIG. 2 is a curve diagram illustrating a phenomenon of ESD (electrostatic discharge)

As shown in FIG. 1, by applying the ggN/PMOS circuit structure that functions as an ESD protection device 10 for an integrated circuit (IC), the instantaneous high voltage in the forward direction can activate the parasitic bipolar device of NMOS 12, guiding high current to the Vss terminal. On the other hand, instantaneous high voltage opposite to the forward direction can activate the parasitic bipolar device of PMOS 14, guiding high current to the Vdd terminal. Next, referring to FIG. 2, the principle of the aforementioned structure is that when an ESD phenomenon occurs at the pad of one input terminal, the ggN/PMOS will be triggered and goes into the snapback region. In the snapback region, the ggN/PMOS will clamp on a low-potential voltage that is crossing over the ggN/PMOS and will maintain high current so that the ESD current can be guided out effectively.

Figure 3:
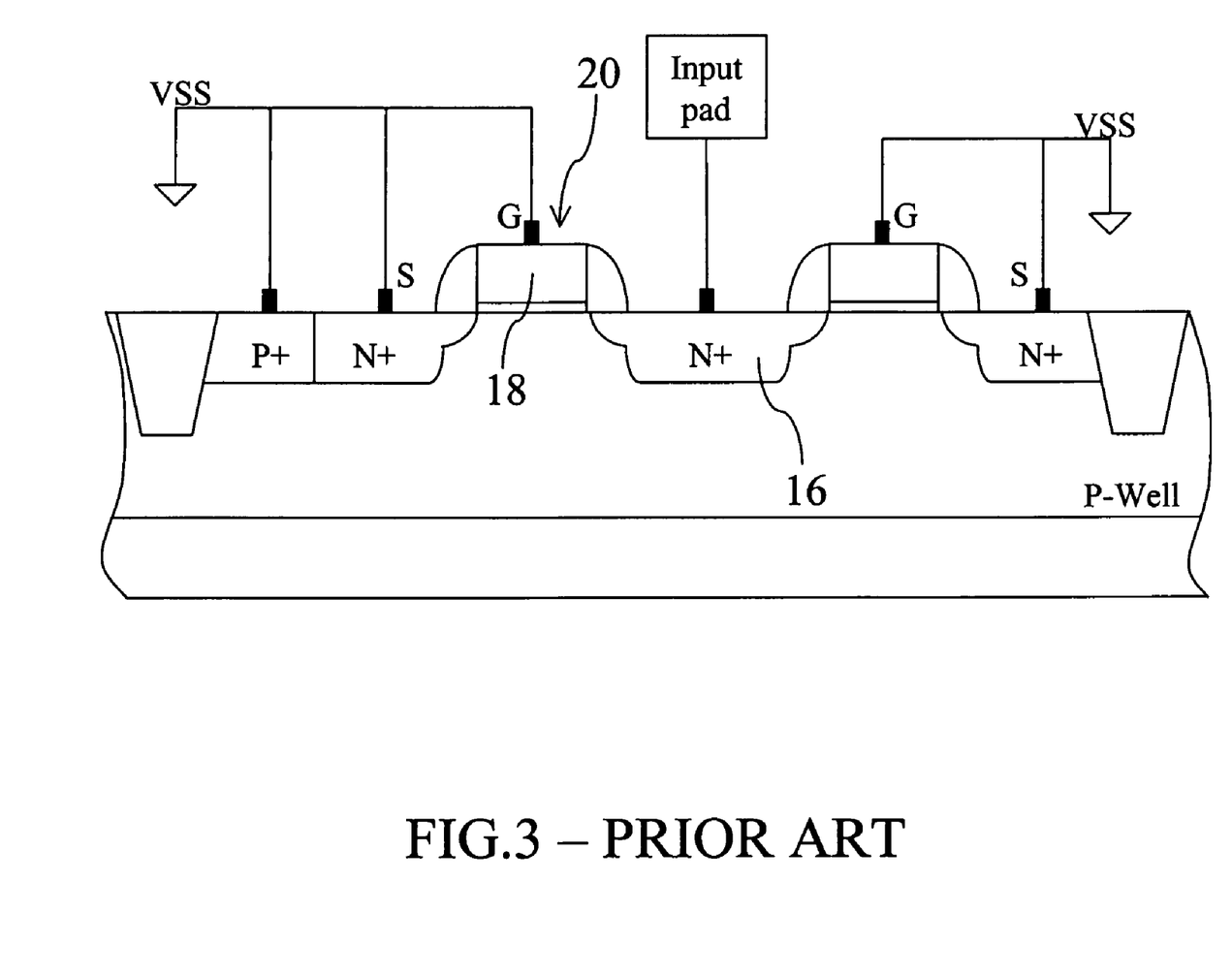
FIG. 3 is a schematic diagram illustrating the structure of conventional MOS elements applied to ESD protection device.

Referring to FIG. 3, when the ggNMOS structure used in the processing of non-self-aligned salicide is applied to the ESD protection device, there will be a ballast distance used as a resistance ballast between the drain contact 16 and the polysilicon gate 18, so that when the NPN transistor 20 is triggered, the high current it generates can be discharged in a rather homogeneous manner.

Figure 4:
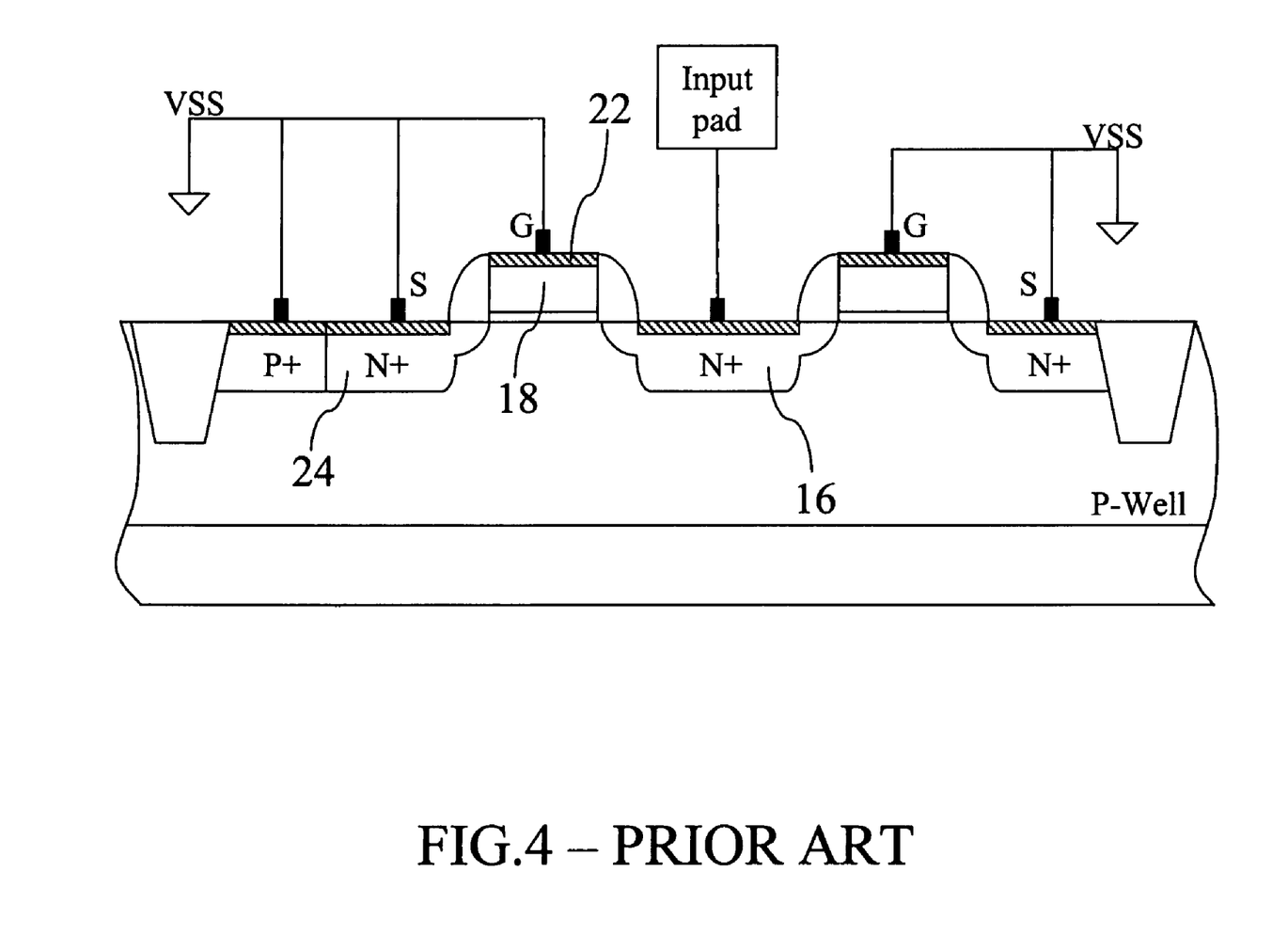
FIG. 4 is a schematic diagram illustrating a structure of transistor of ESD protection device with self-aligned salicide.

However, in deep sub-micron processing, the self-aligned salicide 22 is applied in the region between the polysilicon gate 18 and the source/drain regions 24 and 16 contained in the ESD structure, as shown in FIG. 4. For this reason, there is hardly any resistance ballast existing between the drain contact 16 and the polysilicon gate 18. Therefore, when electrostatic high voltage is generated, the parasitic NPN (or PNP) transistor in the ESD structure will be triggered correspondingly. Although the current generated by high voltage can be discharged, the collector N of the NPN transistor, which is equivalent to the drain of ggNMOS, has no resistance ballast. In addition to that, the structure of collector N is a shallow junction, which can induce inhomogeneous flow of high current; consequently, partial high current and partial heating phenomenon near the drain can be generated. As a result, the ESD structure can be internally damaged, and the functionality of the ESD protection may fail to perform efficiently.

In view of the aforementioned problem, a manufacturing method for transistor of ESD protection device is provided to solve the drawbacks of the prior arts.

SUMMARY OF THE INVENTION

An objective of the present invention is to provide a manufacturing method for transistors of ESD protection devices, which employs a method of retrograde-like implantation to form an extended blocking region of self-aligned salicide located under the drain region for being used as resistance ballast between the drain contact and the ploy-silicon gate so that high current generated by the ESD can be discharged in a more homogeneous way.

Another objective of the present invention is to provide a manufacturing method for transistors of ESD protection devices, capable of effectively guiding out high current generated by electrostatic high voltage so that partial high current and partial heating phenomenon near the drain can be avoided and damages caused to the structure of the ESD protection can be prevented.

Another objective of the present invention is to provide a manufacturing method for transistors of ESD protection devices, which has a deeper drain contact surface.

To achieve the aforementioned objects, the present invention forms basic elements on a semiconductor base, including an isolation structure, a p-well region, a gate structure, and a light-ion doped region used as a heavy-ion doped region for source/drain. Next, a patterned resist layer is formed on the semiconductor base and used as a mask for performing an ion implantation for emerged drain region, so that the dopant can be implanted into the semiconductor base for forming an extended drain heavy-doped region. Then, the patterned resist layer is eliminated or removed and a heat tempering process will be executed to reorganize ions of the base. Finally, the polysilicon gate and the surface of the source/drain region will form self-aligned salicide on the semiconductor base.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

The present invention discloses a method similar to a self-aligned salicide block, which utilizes a method of retrograde-implantation to form an extended blocking region located under the drain region, allowing a resistance ballast to be formed between the drain contact and the ploysilicon gate so that high current generated by the ESD can be discharged in a more homogeneous way. The following description will take an NMOS (n-type transistor) as an example to illustrate the flow of the present invention in detail.

Figure 5A:
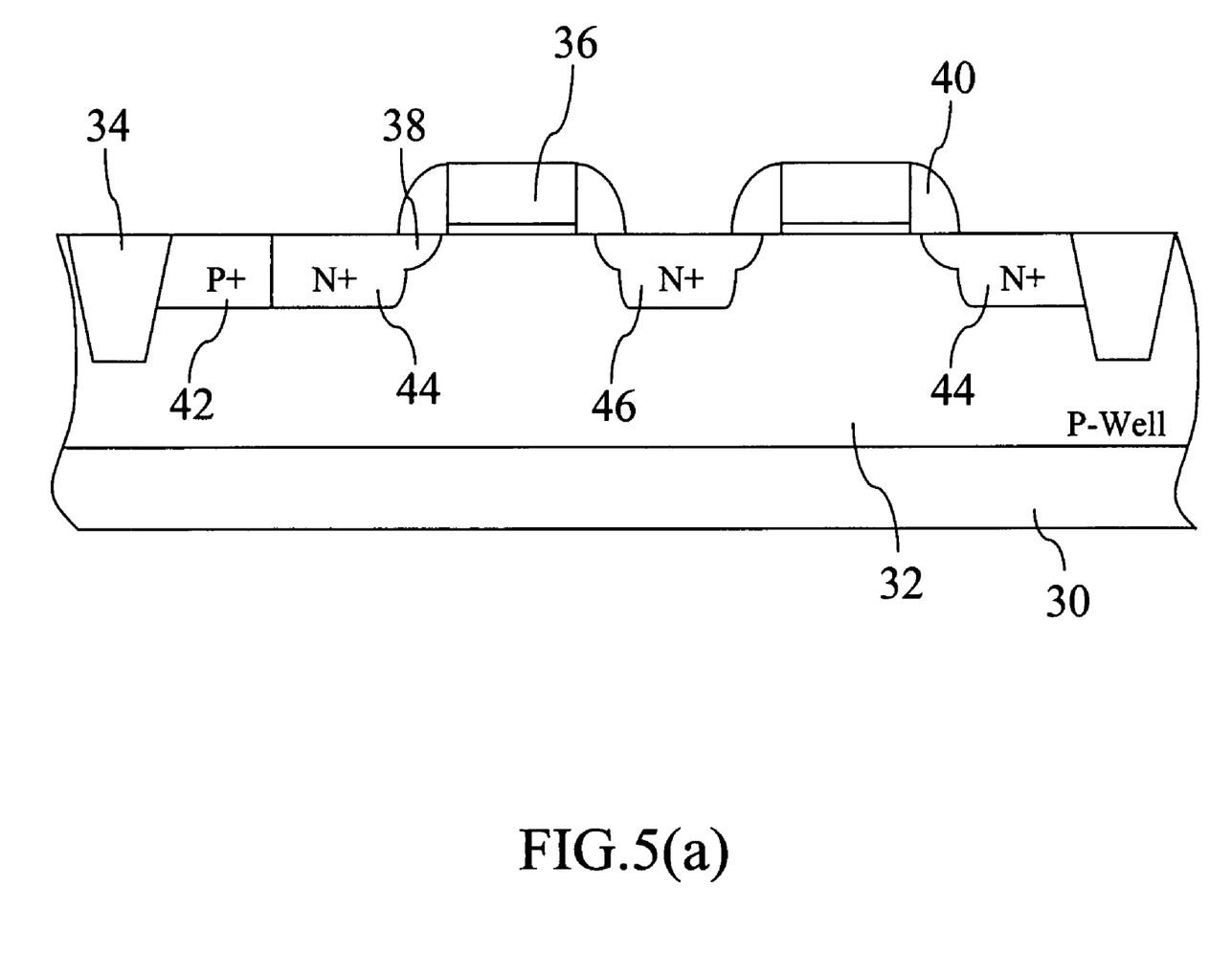
FIGS. 5(a)~5(d) are sectional diagrams illustrating the structure of each step of manufacturing transistor according to embodiments of the present invention.

FIGS. 5(a)–5(d) illustrate the preferred embodiment of the present invention, which respectively show the sectional structure of each step of manufacturing a transistor applied to an ESD protection circuit. Referring to all these FIGS., the manufacturing method of the present invention includes the following procedures:

First, referring to FIG. 5(a) that illustrates standard deep sub-micron processing, a p-well 32 is formed on the semiconductor base 30 through doping, and a plurality of shallow trench isolations 34 is formed in the p-well 32. Next, a polysilicon gate structure 36 is formed on top of the base 30, and being used as a mask, the polysilicon gate structure 36 can perform low-concentration ion implantation on the p-well 32 so as to form a light-ion doped region 38. After that, a gate gap wall 40 will be formed near each of two sidewalls of the polysilicon gate structure 36. Then, the polysilicon gate structure 36 and the gate gap wall 40 will be used as masks to proceed high-concentration p-type and n-type heavy-ion implantation on the p-well 32, so that a p-type heavy-ion doped region 42 and n-type heavy-ion doped regions 44 and 46 can be formed respectively. Among these regions, the p-type heavy-ion doped region 42 and n-type heavy-ion doped region 44 can be used as source regions, whereas the n-type heavy doped region 46 will be used as a drain region. Then, a fast heat treatment process will be executed. Thus, the basic elements on semiconductor base 30 are completed.

Figure 5B:
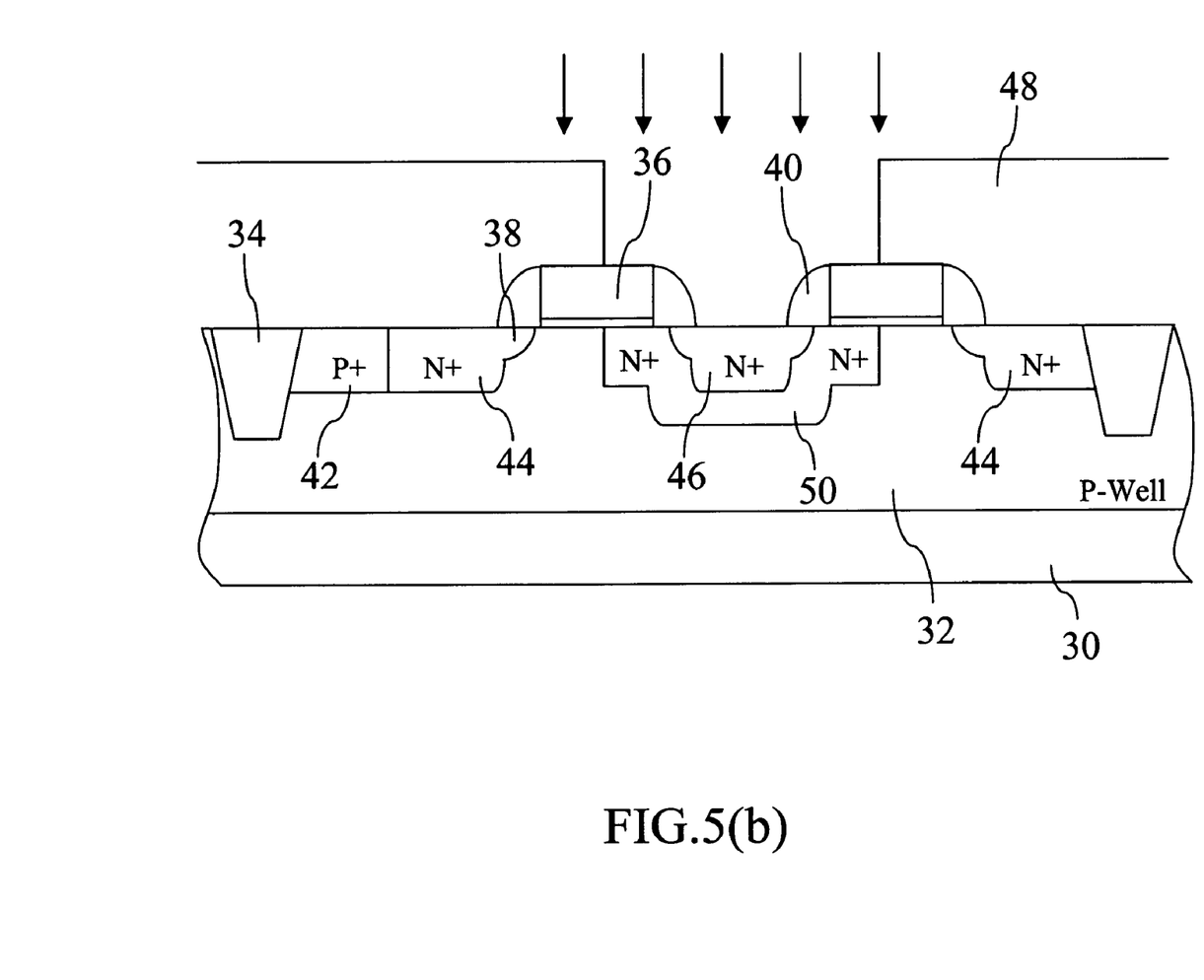

Next, referring to FIG. 5(b), a patterned resist layer 48 is formed on the semiconductor base 30 through processes of lithography and etching so that the patterned resist layer 48 can emerge from the n-type heavy-ion doped region 46 that is used as the drain region. The patterned resist layer 48 is also used as a mask capable of performing ion implantation with high energy approximately larger than 200 KeV in the emerged drain region 46. Alternatively, a dopant of phosphorous ion or arsenic ion can be implanted into the semiconductor base 30 with concentration level larger than $1 \times 10^{13}$ square centimeters to form an extended drain heavy-doped region 50.

Figure 5C:
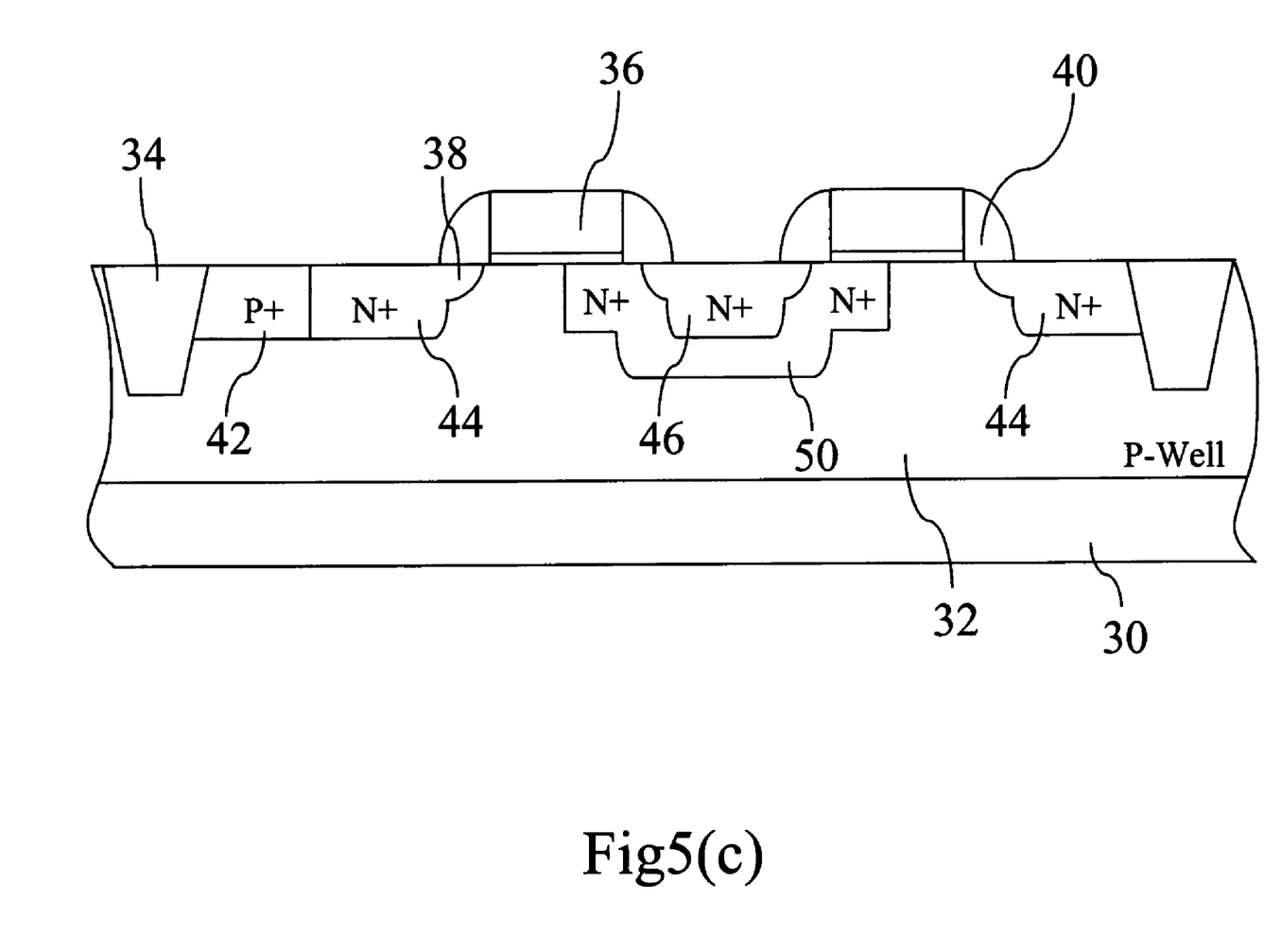

After the extended drain heavy-doped region 50 is complete, the etching technique can be employed to eliminate the patterned resist layer 48, as shown in FIG. 5(c), followed by a heat tempering processing to reorganize the heavy-doped n-type ion and p-type ion in the semiconductor base 30.

Figure 5D:
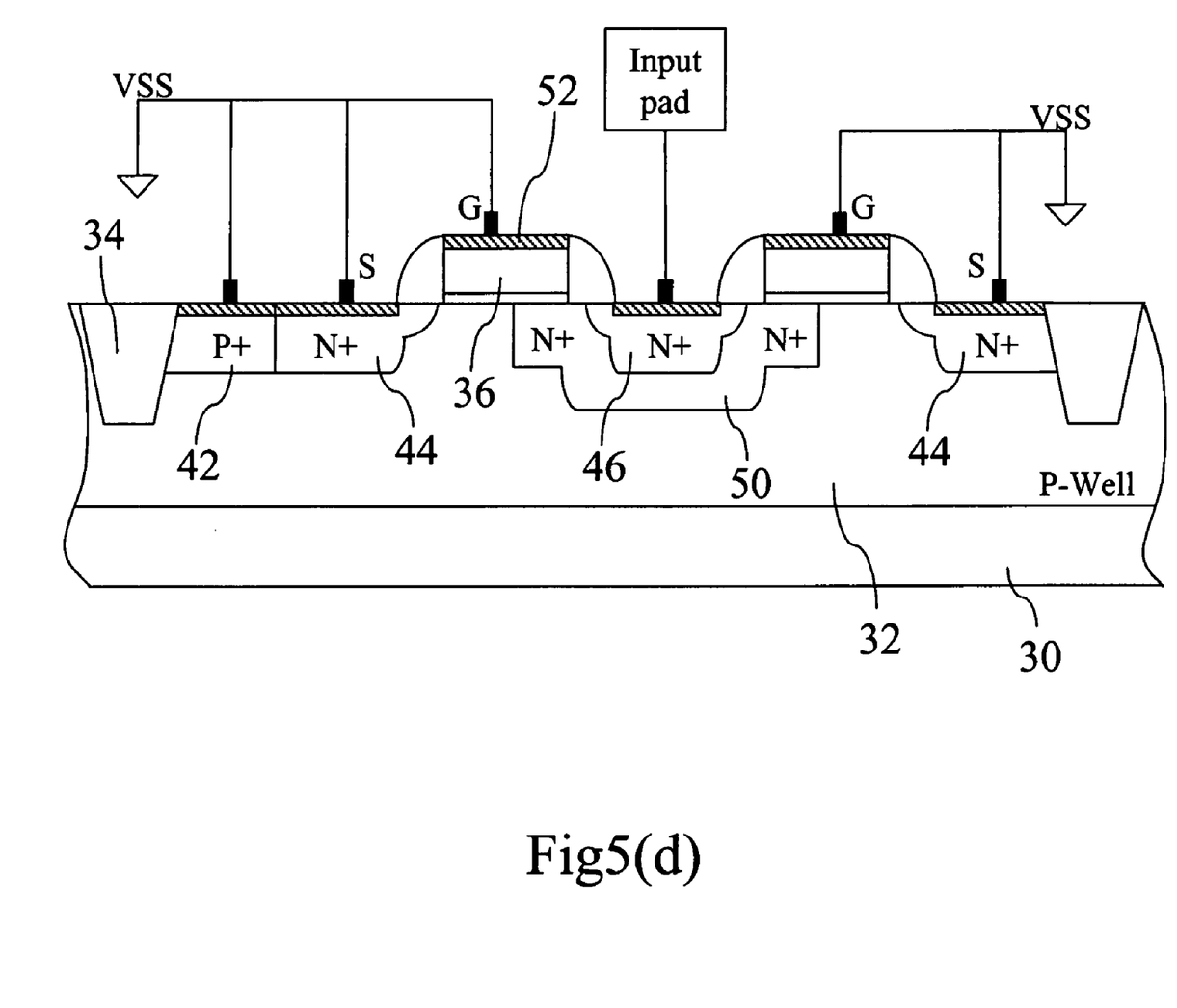

Finally, as shown in FIG. 5(d), a self-aligned salicide 52 will be formed in the semiconductor base 30 on each surface of the following elements: the polysilicon gate structure 36, the p-type heavy-ion doped region 42, and the n-type heavy-ion doped regions 44 and 46. Thus, the structure of ESD transistor for entire deep sub-micron salicide processing is completed, wherein the procedures for forming self-aligned salicide 52 further includes the following steps: first, a titanium metal layer is formed on the surface of a semiconductor base 30 through sputtering; then, a prompt high-temperature heating process is executed, which in turn allows the contact portion among the surfaces of the titanium layer, polysilicon gate structure, and heavy-ion doped region to generate salicide reaction and form $TiSi_2$ (titanium salicide), followed by a self-alignment for forming salicide. Alternatively, the titanium that did not join a salicide reaction or the titanium remainder after the salicide reaction can be selectively eliminated by a wet etching method. Therefore, a self-aligned salicide structure 52 can be formed on the semiconductor base 30, as shown in FIG. 5(d). As to the material of the aforementioned metal layer, in addition to titanium, it can be other metals such as cobalt, nickel, palladium, or platinum.

The present invention forms an extended drain heavy-doped region that is used as an extended blocking region located under the drain region so as to form a resistance ballast between the drain contact and the ploysilicon channel. In addition, the surface of the drain contact used for the ESD structure is deeper in its depth, and for this reason, the high current generated by the ESD can be discharged in a more homogeneous manner, which can prevent partial high current from being generated near the drain region. Therefore, the present invention can guide out high current generated by electrostatic high voltage. Consequently, partial high current and partial heating phenomenon generated near the drain region can be avoided. As a result, the ESD protection structure can be effectively protected from damage.

The embodiment above is only intended to illustrate the present invention; it does not, however, to limit the present invention to the specific embodiment. Accordingly, various modifications and changes may be made without departing from the spirit and scope of the present invention as described in the following claims.

What is claimed is:

1. A manufacturing method for a transistor of an electrostatic discharge protection device, comprising:

providing a semiconductor base, on which basic elements are formed, comprising an isolation structure, a p-well region, a polysilicon gate structure, and doped regions for forming source/drain regions, at least one source/drain region having both light-ion doped and heavy-ion doped areas;

forming a patterned resist layer used as a mask on the semiconductor base and exposing an area including a substantial portion of the polysilicon gate structure and an adjacent drain region for performing ion implantation in the exposed area so that a dopant can be implanted into the semiconductor base to form an extended drain heavy-doped region extending under the exposed portion of the polysilicon gate structure;

eliminating the patterned resist layer and proceeding with heat tempering processing; and forming self-aligned salicide in the semiconductor base on the surfaces of the polysilicon gate and the source/drain regions.

2. The manufacturing method for a transistor of an electrostatic discharge protection device of claim 1, wherein the isolation structure is a shallow trench isolation structure.

3. The manufacturing method for a transistor of an electrostatic discharge protection device of claim 1, wherein the p-well region comprises an n-type well region and a p-type well region.

4. The manufacturing method for a transistor of an electrostatic discharge protection device of claim 1, wherein the heavy-ion doped region comprises n-type and p-type heavy-ion doped regions.

5. The manufacturing method for a transistor of an electrostatic discharge protection device of claim 1, wherein the dopant for forming the drain heavy doped region comprises phosphorous ion or arsenic ion.

6. The manufacturing method for a transistor of an electrostatic discharge protection device of claim 1, wherein the ion implantation performed in the step of forming the extended drain heavy doped region is implanted by using high energy larger than 200 KeV, and the dopant is implanted into the semiconductor base with a concentration level larger than $1 \times 10^{13}$ square centimeters.

7. The manufacturing method for a transistor of an electrostatic discharge protection device of claim 1, wherein forming the self-aligned salicide further comprises:
  forming a metal layer on the semiconductor base;
  performing a high-temperature heating process, which in turn allows a salicide reaction to be generated between the metal layer and respective contact portions on the surfaces of the polysilicon gate structure, the heavy-ion doped areas of source and drain regions, and the isolation structure to thereby form self-aligned salicide structures; and
  removing any leftover metal layer.

8. The manufacturing method for a transistor of an electrostatic discharge protection device of claim 7, wherein the metal layer comprises titanium, cobalt, nickel, palladium, platinum, or a combination of these.

9. The manufacturing method for a transistor of an electrostatic discharge protection device of claim 7, wherein the high-temperature heating is completed by prompt heating processing.

10. The manufacturing method for a transistor of an electrostatic discharge protection device of claim 7, wherein the leftover metal layer is removed by wet etching.

11. A manufacturing method for a transistor of an electrostatic discharge protection device, comprising:
  providing a semiconductor base, on which basic elements are formed, comprising a shallow trench isolation structure, a p-well region, a polysilicon gate structure, and doped region for forming source/drain regions, at least one source/drain region having both light-ion doped and heavy-ion doped areas; the p-well region comprising an n-type well region and a p-type well region; the heavy-ion doped region comprising n-type and p-type heavy-ion doped regions;
  forming a patterned resist layer used as a mask on the semiconductor base and exposing an area including a substantial portion of the polysilicon gate structure and an adjacent drain region for performing ion implantation in the exposed area so that a dopant can be implanted into the semiconductor base to form an extended drain heavy-doped region extending under the exposed portion of the polysilicon gate structure;
  eliminating the patterned resist layer and proceeding with heat tempering processing; and
  forming self-aligned salicide in the semiconductor base on the surfaces of the polysilicon gate and the source/drain regions, comprising:
    forming a metal layer on the semiconductor base;
    performing a high-temperature heating process, which in turn allows a salicide reaction to be generated between the metal layer and respective contact portions on the surfaces of the polysilicon gate structure, the heavy-ion doped areas of source and drain regions and the isolation structure to thereby form self-aligned salicide structures; and
    removing any leftover metal layer by a wet etching process.

12. The manufacturing method for a transistor of an electrostatic discharge protection device of claim 11, wherein the dopant for forming the drain heavy doped region comprises phosphorous ion or arsenic ion.

13. The manufacturing method for a transistor of an electrostatic discharge protection device of claim 11, wherein the ion implantation performed in the step of forming the extended drain heavy doped region is implanted by using high energy larger than 200 KeV, and the dopant is implanted into the semiconductor base with a concentration level larger than $1 \times 10^{13}$ square centimeters.

14. The manufacturing method for a transistor of an electrostatic discharge protection device of claim 11, wherein the metal layer comprises titanium, cobalt, nickel, palladium, platinum, or a combination of these.

15. The manufacturing method for a transistor of an electrostatic discharge protection device of claim 11, wherein the high-temperature heating is completed by prompt heating processing.

* * * * *